(12) United States Patent
Ikeda

(10) Patent No.: US 9,011,653 B2
(45) Date of Patent: Apr. 21, 2015

(54) SPUTTERING TARGET

(75) Inventor: Makoto Ikeda, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 29 days.

(21) Appl. No.: 13/989,251

(22) PCT Filed: Nov. 28, 2011

(86) PCT No.: PCT/JP2011/077362
§ 371 (c)(1),
(2), (4) Date: May 23, 2013

(87) PCT Pub. No.: WO2012/073882
PCT Pub. Date: Jun. 7, 2012

(65) Prior Publication Data
US 2013/0240352 A1 Sep. 19, 2013

(30) Foreign Application Priority Data
Nov. 29, 2010 (JP) ................. 2010-265037

(51) Int. Cl.
| | | |
|---|---|---|
| *G11B 5/851* | (2006.01) |
| *C23C 14/34* | (2006.01) |
| *C22C 33/02* | (2006.01) |
| *H01F 41/18* | (2006.01) |

(52) U.S. Cl.
CPC ............ *G11B 5/851* (2013.01); *C23C 14/3414* (2013.01); *H01F 41/183* (2013.01); *C22C 33/0278* (2013.01); *B22F 2998/10* (2013.01)

(58) Field of Classification Search
CPC ...... G11B 5/851; C23C 14/3414; C22C 1/05; C22C 1/055; B22F 1/0003; B22F 2301/25; B22F 2301/255; B22F 2301/35

USPC ....................................................... 204/298.13
See application file for complete search history.

(56) References Cited

U.S. PATENT DOCUMENTS

| | | | |
|---|---|---|---|
| 7,241,520 B2 | 7/2007 | Shin et al. | |
| 8,158,276 B2 | 4/2012 | Hasegawa | |
| 8,419,400 B2 * | 4/2013 | Itoh et al. | .......... 425/78 |
| 2007/0189916 A1 | 8/2007 | Zhang | |

(Continued)

FOREIGN PATENT DOCUMENTS

| | | |
|---|---|---|
| CN | 1822114 A | 8/2006 |
| JP | 2003313659 A | 11/2003 |
| JP | 2004152471 A | 5/2004 |

(Continued)

OTHER PUBLICATIONS

Translation to Fujioka (JP 2003-313659) published Nov. 2003.*

(Continued)

*Primary Examiner* — John Brayton
(74) *Attorney, Agent, or Firm* — The Webb Law Firm

(57) ABSTRACT

Provided is a sputtering target characterized by containing Ag and C. The sputtering target contains Ag in addition to Fe, Pt and C. By allowing the sputtering target to contain Ag, the sputtering target has high density. As a result, when the sputtering target is placed in a vacuum atmosphere in the sputtering process, the amount of a gas emitted from the sputtering target can be reduced, and the properties of a thin film formed by sputtering can be improved. Moreover, even when the sputtering target is produced by low-temperature sintering, it has high density.

4 Claims, 1 Drawing Sheet

(56) References Cited

U.S. PATENT DOCUMENTS

| | | |
|---|---|---|
| 2013/0098760 A1 | 4/2013 | Takami et al. |
| 2013/0168240 A1 | 7/2013 | Ogino et al. |

FOREIGN PATENT DOCUMENTS

| | | |
|---|---|---|
| JP | 2006161082 A | 6/2006 |
| JP | 3950838 B2 | 8/2007 |
| JP | 2008060347 A | 3/2008 |
| JP | 2008169464 A | 7/2008 |
| WO | 2012014504 A1 | 2/2012 |
| WO | 2012029498 A1 | 3/2012 |

OTHER PUBLICATIONS

Translation to Ishii (JP 2006-161082 cited on IDS ) published Jun. 2006.*

Zhang et al., $L1_o$-ordered high coercivity(FePt)Ag—C granular thin films for perpendicular recording. Journal of Magnetism and Magnetic Materials, Sep. 2010, vol. 322, No. 18, pp. 2658-2664 (equivalent published in J. Mag. Mag. Mater. (2010) ).

* cited by examiner

SPUTTERING TARGET

TECHNICAL FIELD

The present invention relates to a sputtering target, and more particularly to a sputtering target of high density containing Fe, Pt, Ag and C and capable of forming a magnetic recording film without requiring a large-scale apparatus.

BACKGROUND ART

As magnetic recording films to constitute hard disks and the like mounted on computers, etc., CoPt-based thin films have been used in the past, and increase of recording density has been achieved by a perpendicular magnetic recording system. In recent years, however, a demand for increase of recording density has been strengthened more and more, and it has become difficult for the CoPt-based thin films to meet the demand.

Then, as magnetic recording films of the next generation that substitute for the CoPt-based thins films, FePt-based thin films have been proposed. The FePt-based thin films have an advantage of higher magnetic anisotropy as compared with the CoPt-based thin films. On the other hand, the FePt-based thin films have a disadvantage that because the particles constituting the thin films become excessively large, the structures of the thin films become disordered to thereby lower magnetic properties.

On this account, techniques to control the magnetic properties by adding carbon or the like to the FePt-based thin films have been studied.

In Japanese Patent No. 3,950,838, a technique of sputtering Fe sputtering target, Pt sputtering target and C sputtering target at the same time to obtain a FePtC-based magnetic recording film having excellent magnetic properties has been disclosed.

In this technique, however, there is a problem such that because three-element simultaneous sputtering using three kinds of sputtering targets is carried out, three or more cathodes for placing the sputtering targets thereon are required, and a large-scale apparatus becomes necessary.

This problem can be solved by preparing a sputtering target containing all the elements that constitute a magnetic recording film, such as Fe, Pt and C. If this sputtering target is used, it is enough just to sputter one sputtering target, and therefore, plural cathodes for placing sputtering targets become unnecessary. Hence, a FePtC-based magnetic recording film can be obtained without requiring a large-scale apparatus.

However, if carbon is contained in the sputtering target in a high concentration, it becomes difficult to increase the density of the sputtering target. If the density of the sputtering target is low, there occurs a problem that when the sputtering target is placed in a vacuum atmosphere in the sputtering process, the amount of a gas emitted from the sputtering target is increased, and the properties of a thin film formed by the sputtering are lowered.

The present invention has been made in order to solve the above problem, and it is an object of the present invention to provide a sputtering target which has high density even if it contains carbon in a high concentration and which is capable of providing a FePtC-based magnetic recording film of high performance.

SUMMARY OF THE INVENTION

The present invention to achieve the above object is a sputtering target characterized by containing Fe, Pt, Ag and C.

In the sputtering target, the ratio of the content of Ag to the total content of Fe, Pt and Ag is preferably 1 to 20% by mol.

The sputtering target is preferably produced by calcining a raw material powder containing Fe powder, Pt powder, Ag powder and C powder.

The density of the sputtering target is preferably not less than 90%.

The sputtering target of the present invention contains Ag in addition to Fe, Pt and C. By allowing the sputtering target of the present invention to contain Ag, the sputtering target has high density. As a result, when the sputtering target is placed in a vacuum atmosphere in the sputtering process, the amount of a gas emitted from the sputtering target can be reduced, and the properties of a thin film formed by sputtering can be improved. Moreover, even when the sputtering target of the present invention is produced by low-temperature sintering, it has high density.

DETAILED DESCRIPTION OF THE INVENTION

Figure 1:
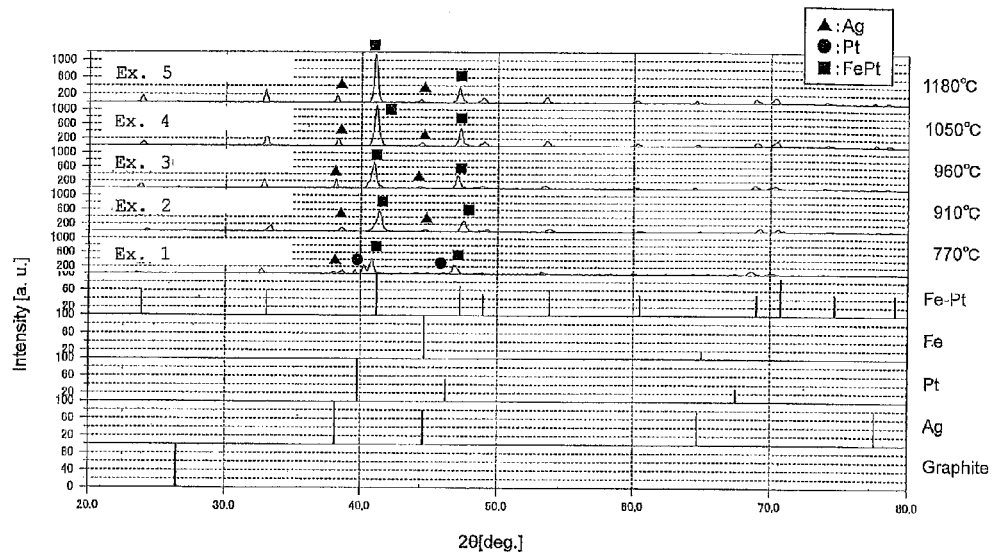
FIG. 1 shows X-ray diffraction patterns of sputtering targets obtained in Examples 1 to 5.

The sputtering target of the present invention contains Fe, Pt, Ag and C. That is to say, the sputtering target of the present invention is a sputtering target wherein Ag is allowed to be newly contained in a FePtC-based sputtering target that has been heretofore studied.

When Ag is allowed to be contained in a sputtering target in addition to Fe, Pt and C, the density of the sputtering target can be increased. The reason why the density of the sputtering target is increased by allowing Ag to be contained is thought to be as follows. When a mixed powder consisting of Fe powder and Pt powder is calcined, Fe and Pt are dissolved in each other as solid solutions, and the components are densely packed, and hence, a sputtering target having high density is obtained. On the other hand, it is thought that when a mixed powder consisting of Fe powder, Pt powder and C powder is calcined, C inhibits dissolution of Fe and Pt in each other as solid solutions, and the components are not packed densely, and hence, it is difficult to obtain a FePtC-based sputtering target of high density. It is thought that when a mixed powder consisting of Fe powder, Pt powder, C powder and Ag powder is calcined, Ag accelerates dissolution of Fe and Pt in each other as solid solutions even if C is present, and therefore, the components are packed densely, and a sputtering target of high density is obtained. The above matters will be described in detail in the working examples described later.

The sputtering target of the present invention comprises Fe, Pt, Ag and C, and in some cases, inevitable impurities are contained in addition to them.

The content of Ag is preferably 1 to 20% by mol, more preferably 5 to 17% by mol, based on the total content of Fe, Pt and Ag. When the content of Ag is in the above range, the sputtering target tends to have high density. On the other hand, if the content of Ag is less than 1% by mol, the sputtering target does not have sufficiently high density in some cases. If the content of Ag is more than 20% by mol, magnetic properties of a film formed by sputtering the sputtering target are sometimes lowered.

The ratios of Fe, Pt, Ag and C contained in the sputtering target of the present invention are as follows: when composition of the sputtering target of the present invention is represented by $[(Fe_xPt_{100-x})_{100-y}—Ag_y]_{100-z}—C_z$ (x, y, z: % by mol), x is preferably 45 to 65, more preferably 49 to 51, y is preferably 1 to 20, more preferably 5 to 17, and z is preferably 13 to 59, more preferably 32 to 59. When the ratios of Fe, Pt, Ag and C are in the above ranges, a thin film obtained by sputtering this sputtering target can be effectively used as a magnetic recording film.

The relative density of the sputtering target of the present invention is preferably not less than 90%, more preferably not less than 95%. When the relative density is not less than 90%, the amount of a gas emitted from the sputtering target can be reduced in the case where the sputtering target is placed in a vacuum atmosphere in the sputtering process, and therefore, properties of a thin film formed by sputtering can be improved. The relative density is a numerical value measured on the basis of the Archimedes method.

The sputtering target of the present invention can be produced by mixing Fe powder, Pt powder, Ag powder and C powder to prepare a mixed powder, sintering it, and if necessary, subjecting the sintered product to a treatment.

The mean particle diameters of the Fe powder, the Pt powder, the Ag powder and the C powder, as measured by the BET (Brunauer-Emmett-Teller) method, are usually 10 to 70 µm, 1 to 4 µm, 2 to 5 µm, and 3 to 20 µm, respectively.

The proportions of the Fe powder, the Pt powder, the Ag powder and the C powder to be mixed are determined so that the content ratios of Fe, Pt, Ag and C in the resulting sputtering target might be in the aforesaid ranges.

The method to mix the Fe powder, the Pt powder, the Ag powder and the C powder is not specifically restricted, and for example, mixing by a ball mill or the like can be mentioned.

Examples of sintering techniques for the mixed powder include sintering using an electric current sintering method and sintering using a hot pressing (HP) method.

Of these, the electric current sintering method is particularly preferable. In the electric current sintering method, particles are bonded and sintered by electric discharge between particles, and therefore, energy required is small, and sintering at a lower temperature than the temperature in the hot pressing (HP) method or the like is possible. On this account, a sintered product having high density and composed of fine particles is apt to be obtained.

On the other hand, in the hot pressing method, sintering is carried out by external heating, and therefore, much energy is required, so that unless sintering is carried out at a high temperature, a sintered product of high density is not obtained. On this account, there is a strong tendency toward formation of a sintered product composed of coarse particles.

In general, use of a target composed of fine particles has a merit that the resulting film has high uniformity. On the other hand, use of a target composed of coarse particles has a strong tendency to bring about problems such as occurrence of particles. In this regard, the electric current sintering method is superior to the hot pressing method or the like.

As described above, when the electric current sintering method is used, a sintered product having higher relative density is obtained, as compared with the hot pressing method or the like. For example, when the electric current sintering method is used, it is easy to obtain a sintered product having a relative density of not less than 90%, but when the hot pressing method is used, it is difficult to obtain a sintered product having a relative density of not less than 90%.

However, the relative density of the sintered product can be increased by subjecting the sintered product to an additional treatment. Accordingly, even if the relative density of a sintered product obtained by sintering the mixed powder is less than 90%, it is possible to obtain a target having a relative density of not less than 90% by subjecting the sintered product to an additional treatment.

As the additional treatment, hot isostatic pressing (HIP) or the like can be mentioned. By subjecting the sintered product to an additional treatment through the hot isostatic pressing, the density can be increased while maintaining the fine structure. For example, by subjecting the sintered product having been obtained by the hot pressing method to hot isostatic pressing, the relative density of the sintered product can be increased, and even if the relative density of the sintered product is less than 90%, a target having a relative density of not less than 90% can be obtained by carrying out an additional treatment through the hot isostatic pressing. If the sintered product obtained by the electric current sintering method is subjected to the hot isostatic pressing, a target having a much higher relative density can be obtained.

The sintering temperature is usually 700 to 1200° C., preferably 900 to 1100° C. As the sintering temperature is increased, a sputtering target having higher density is obtained. However, if the sintering temperature is too high, a target composed of coarse particles is obtained, and problems such as occurrence of particles are liable to be brought about in the film-forming process.

The sputtering target of the present invention has high density even if the sintering temperature is low.

The sputtering target of the present invention can be sputtered in the same manner as for conventional sputtering targets for magnetic recording films.

By carrying out sputtering using the sputtering target of the present invention, a FePtAgC thin film can be formed. This FePtAgC thin film can be used as a magnetic recording film.

EXAMPLES

Examples 1 to 5

[Production of Sputtering Target]

In a ball mill, Fe powder having a mean particle diameter of 30 µm, Pt powder having a mean particle diameter of 2 µm, Ag powder having a mean particle diameter of 3 µm and C powder having a mean particle diameter of 7 µm were mixed for 1.5 hours so that the content ratios of the Fe powder, the Pt powder, the Ag powder and the C power might become 18.45% by mol, 18.45% by mol, 4.10% by mol and 59.00% by mol, respectively, whereby a mixed powder was prepared. The mean particle diameters are numerical values measured by the BET method.

The resulting mixed powder was sintered using an electric current sintering apparatus under the following conditions to obtain a sintered product having a diameter of 20 mm and a thickness of 5 mm. This sintered product was taken as a sputtering target. When compositions of the sputtering targets obtained in Examples 1 to 5 were each represented by $[(Fe_xPt_{100-x})_{100-y}—Ag_y]_{100-z}—C_z$ (x, y, z: % by mol), x was 50, y was 10, and z was 9, in any of the sputtering targets.

<Sintering Conditions>
Sintering atmosphere: vacuum
Temperature rising time: 10 min
Sintering temperature: as shown in Table 1
Sintering keeping time: 10 min
Pressure: 0.4 t/cm$^2$
Temperature dropping: natural cooling in furnace
[Measurement of Relative Density]

A relative density of the resulting sputtering target was measured on the basis of the Archimedes method. Specifically, weight-in-air of the sputtering target was divided by volume (=weight-in-water of sputtering target sintered product/specific gravity of water at measuring temperature), and a percentage value to the theoretical density ρ (g/cm³) based on the following formula (X) was taken as a relative density (unit: %). The results are set forth in Table 1.

[Math. 1]

$$\rho \equiv \left( \frac{C_1/100}{\rho_1} + \frac{C_2/100}{\rho_2} + \ldots + \frac{C_i/100}{\rho_i} \right)^{-1} \quad (X)$$

In the formula (X), $C_1$ to $C_i$ are each a content (% by weight) of a constitutional substance of a target sintered product, and $\rho_1$ to $\rho_i$ are densities (g/cm³) of constitutional substances corresponding to $C_1$ to $C_i$, respectively.

[Evaluation of Appearance of Sputtering Target after Molding]

The appearance of the resulting sputtering target was observed by the naked eye, and the appearance of the sputtering target after molding was evaluated.

The results are set forth in Table 1. In Table 1, the term "melt" means that the particles are melted during heating, and the melt leaks through a gap of the mold and is solidified. The term "broken edge" means that when a pressure is applied to the sputtering target with a finger, the edge of the sputtering target is broken. When phenomena of "melt" and "broken edge" did not occur, the column was left blank.

[X-Ray Diffraction Measurement]

The resulting sputtering target was subjected to X-ray diffraction measurement under the following conditions.
Measuring method: 2θ/θ method
Sampling width: 0.02°
Scanning speed: 4°/min
Vacuum tube: Cu The resulting diffraction patterns are shown in FIG. 1. In FIG. 1, five charts on the lower side are charts showing peak positions of C, Ag, Pt, Fe and Fe—Pt (intermetallic compound of Fe and Pt), respectively, from the bottom. The temperatures shown on the right-hand side of FIG. 1 are sintering temperatures. In FIG. 1, peaks with black circles are peaks of Pt, peaks with black triangles are peaks of Ag, and peaks with black squares are peaks of Fe—Pt.

Comparative Examples 1 to 6

[Production of Sputtering Target]

In a ball mill, Fe powder having a mean particle diameter of 30 μm, Pt powder having a mean particle diameter of 2 μm and C powder having a mean particle diameter of 7 μm were mixed for 1.5 hours so that the content ratios of the Fe powder, the Pt powder and the C power might become 20.5% by mol, 20.5% by mol and 59% by mol, respectively, whereby a mixed powder was prepared. The mean particle diameters are numerical values measured by the BET method.

The resulting mixed powder was sintered using the same electric current sintering apparatus as in Example 1 under the aforesaid conditions to obtain a sintered product having a diameter of 20 mm and a thickness of 5 mm. This sintered product was taken as a sputtering target. When composition of this sputtering target was represented by $(Fe_x Pt_{100-x})_{100-y}$—$C_y$ (x, y: % by mol), x was 50, and y was 59.

The resulting sputtering targets were subjected to measurement of relative density and evaluation of appearance of the sputtering targets after molding in the same manner as above. The results are set forth in Table 1.

The resulting sputtering targets were subjected to X-ray diffraction measurement in the same manner as above.

Figure 2:
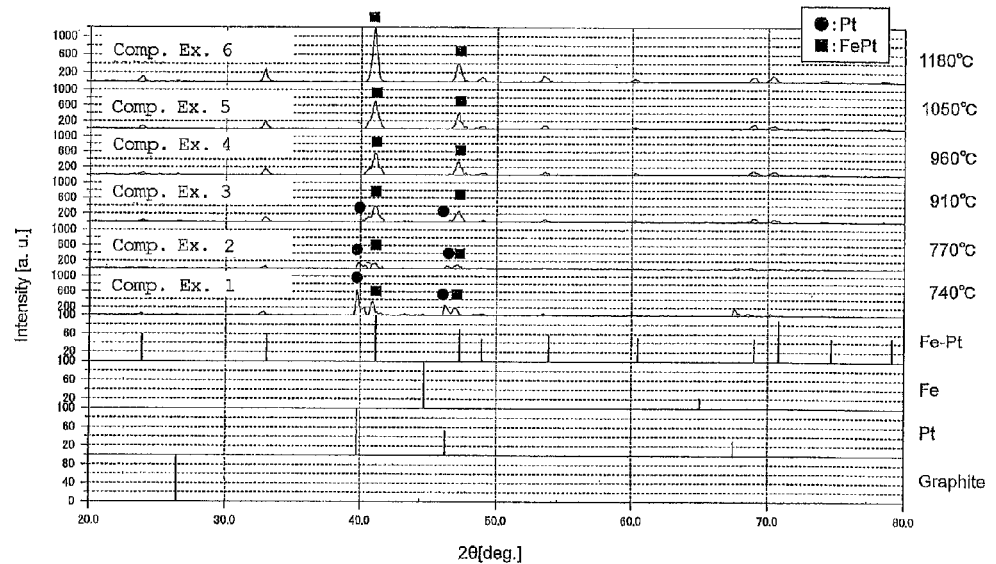
FIG. 2 shows X-ray diffraction patterns of sputtering targets obtained in Comparative Examples 1 to 6.

The resulting diffraction patterns are shown in FIG. 2. In FIG. 2, four charts on the lower side are charts showing peak positions of C, Pt, Fe and Fe—Pt (intermetallic compound of Fe and Pt), respectively, from the bottom. The temperatures shown on the right-hand side of FIG. 2 are sintering temperatures. In FIG. 2, peaks with black circles are peaks of Pt, and peaks with black squares are peaks of Fe—Pt.

TABLE 1

|  | Sintering temperature (°C.) | Relative density (%) | Appearance after molding |
|---|---|---|---|
| Ex. 1 | 770 | 93.4 |  |
| Ex. 2 | 910 | 95.9 |  |
| Ex. 3 | 960 | 98.8 |  |
| Ex. 4 | 1050 | 95.4 |  |
| Ex. 5 | 1180 | 96.7 | melt |
| Comp. Ex. 1 | 740 | 88.7 | broken edge |
| Comp. Ex. 2 | 770 | 88.7 | broken edge |
| Comp. Ex. 3 | 910 | 90.6 |  |
| Comp. Ex. 4 | 960 | 92.2 |  |
| Comp. Ex. 5 | 1050 | 94.6 |  |
| Comp. Ex. 6 | 1180 | 95.2 |  |

From Table 1, it can be seen that the sputtering targets (Examples 1 to 5) composed of Fe, Pt, Ag and C have a higher relative density as compared with the sputtering targets (Comparative Examples 1 to 6) composed of Fe, Pt and C, which were sintered at the same temperatures. In the case of the sputtering targets composed of Fe, Pt and C, the relative density does not become not less 90% unless the sintering temperature is not lower than 910° C. In the case of the sputtering targets composed of Fe, Pt, Ag and C, however, the relative density becomes not less 90% when the sintering temperature is not lower than 770° C. That is to say, it can be understood that when Ag is allowed to be contained in a FePtC-based sputtering target, a sputtering target of high density is obtained at a lower sintering temperature.

In FIG. 1 and FIG. 2, the state of each component present in the sputtering targets is confirmed.

In FIG. 2, when the sintering temperature is not higher than 910° C., peaks of Pt are confirmed, and peaks of Fe—Pt (intermetallic compound of Fe and Pt) are small, so that it can be understood that dissolution of Fe and Pt in each other as solid solutions has not sufficiently proceeded. On the other hand, when the sintering temperature is not lower than 960° C., no peak of Pt is confirmed, and large peaks of Fe—Pt are confirmed, so that it can be understood that dissolution of Fe and Pt in each other as solid solutions has sufficiently proceeded.

In FIG. 1, when the sintering temperature is 770° C., peaks of Pt are confirmed, but the peaks of Pt are smaller, and peaks of Fe—Pt are larger as compared with those of charts at the same sintering temperature in FIG. 2. On the other hand, when the sintering temperature is not lower than 910° C., no peak of Pt is confirmed, so that it can be understood that dissolution of Fe and Pt in each other as solid solutions has sufficiently proceeded.

In FIG. 1 and FIG. 2, the sizes of peaks of Ag and C do not depend upon the sintering temperature, and peaks of almost the same sizes are confirmed in the charts at each sintering temperature. From this, it is thought that Ag and C are not dissolved as solid solutions and they are each present independently.

From the above, it can be understood that in both of the sputtering targets composed of Fe, Pt, Ag and C and the sputtering targets composed of Fe, Pt and C, dissolution of Fe and Pt in each other as solid solutions proceeds as the sintering temperature is increased, and the relative density is increased. It can be understood that in the case of the sputtering targets composed of Fe, Pt, Ag and C, the degree of progress of dissolution of Fe and Pt in each other as solid solutions is higher even at a lower sintering temperature, and higher relative density is obtained, as compared with the case of the sputtering targets composed of Fe, Pt and C. That is to say, it is thought that Ag accelerates dissolution of Fe and Pt in each other as solid solutions, and as a result, the relative density of the sputtering target is increased.

Example 6

A mixed powder was prepared in the same manner as in Example 1, except that the content ratios of the Fe powder, the Pt powder, the Ag powder and the C powder were changed to 19.48% by mol, 19.48% by mol, 2.05% by mol and 59.00% by mol, respectively.

The resulting mixed powder was sintered using the same electric current sintering apparatus as in Example 1 under the same conditions as in Example 1, except that the sintering temperature was changed to 1000° C., whereby a sintered product having a diameter of 20 mm and a thickness of 5 mm was obtained. This sintered product was taken as a sputtering target. When composition of this sputtering target was represented by $[(Fe_xPt_{100-x})_{100-y}—Ag_y]_{100-z}—C_z$ y, z: % by mol), x was 50, y was 5, and z was 59.

A relative density of the resulting sputtering target was determined in the same manner as in Example 1. The appearance of the resulting sputtering target after molding was evaluated in the same manner as in Example 1. The results are set forth in Table 2.

Example 7

A mixed powder was prepared in the same manner as in Example 1, except that the content ratios of the Fe powder, the Pt powder, the Ag powder and the C powder were changed to 19.14% by mol, 19.14% by mol, 2.73% by mol and 59.00% by mol, respectively.

The resulting mixed powder was sintered using the same electric current sintering apparatus as in Example 1 under the same conditions as in Example 1, except that the sintering temperature was changed to 950° C., whereby a sintered product having a diameter of 20 mm and a thickness of 5 mm was obtained. This sintered product was taken as a sputtering target. When composition of this sputtering target was represented by $[(Fe_xPt_{100-x})_{100-y}—Ag_y]_{100-z}—C_z$ (x, y, z: % by mol), x was 50, y was 6.67, and z was 59.

A relative density of the resulting sputtering target was determined in the same manner as in Example 1. The appearance of the resulting sputtering target after molding was evaluated in the same manner as in Example 1. The results are set forth in Table 2.

Example 8

A mixed powder was prepared in the same manner as in Example 1, except that the content ratios of the Fe powder, the Pt powder, the Ag powder and the C powder were changed to 17.77% by mol, 17.77% by mol, 5.47% by mol and 59.00% by mol, respectively.

The resulting mixed powder was sintered using the same electric current sintering apparatus as in Example 1 under the same conditions as in Example 1, except that the sintering temperature was changed to 900° C., whereby a sintered product having a diameter of 20 mm and a thickness of 5 mm was obtained. This sintered product was taken as a sputtering target. When composition of this sputtering target was represented by $[(Fe_xPt_{100-x})_{100-y}—Ag_y]_{100-z}—C_z$ (x, y, z: % by mol), x was 50, y was 13.33, and z was 59.

A relative density of the resulting sputtering target was determined in the same manner as in Example 1. The appearance of the resulting sputtering target after molding was evaluated in the same manner as in Example 1. The results are set forth in Table 2.

Example 9

A mixed powder was prepared in the same manner as in Example 1, except that the content ratios of the Fe powder, the Pt powder, the Ag powder and the C powder were changed to 17.09% by mol, 17.09% by mol, 6.83% by mol and 59.00% by mol, respectively.

The resulting mixed powder was sintered using the same electric current sintering apparatus as in Example 1 under the same conditions as in Example 1, except that the sintering temperature was changed to 850° C., whereby a sintered product having a diameter of 20 mm and a thickness of 5 mm was obtained. This sintered product was taken as a sputtering target. When composition of this sputtering target was represented by $[(Fe_xPt_{100-x})_{100-y}—Ag_y]_{100-z}—C_z$ (x, y, z: % by mol) x was 50, y was 16.67, and z was 59.

A relative density of the resulting sputtering target was determined in the same manner as in Example 1. The appearance of the resulting sputtering target after molding was evaluated in the same manner as in Example 1. The results are set forth in Table 2.

Example 10

A sintered product was obtained by the same production process as in Example 8. The resulting sintered product was treated using a hot isostatic pressing apparatus under the following conditions to obtain a sputtering target.

<Treating Conditions>
Atmosphere: argon
Temperature: 900° C.
Pressure: 118 MPa

When composition of this sputtering target was represented by $[(Fe_xPt_{100-x})_{100-y}—Ag_y]_{100-z}—C_z$ (x, y, z: % by mol), x was 50, y was 13.33, and z was 59.

A relative density of the resulting sputtering target was determined in the same manner as in Example 1. The appearance of the resulting sputtering target after molding was evaluated in the same manner as in Example 1. The results are set forth in Table 2.

TABLE 2

| | x (% by mol) | y (% by mol) | z (% by mol) | Sintering temperature (° C.) | Relative density (%) | Appearance after molding |
|---|---|---|---|---|---|---|
| Ex. 6 | 50 | 5 | 59 | 1000 | 93.9 | |
| Ex. 7 | 50 | 6.67 | 59 | 950 | 95.6 | |
| Ex. 8 | 50 | 13.33 | 59 | 900 | 90.1 | |
| Ex. 9 | 50 | 16.67 | 59 | 850 | 95.4 | |
| Ex. 10 | 50 | 13.33 | 59 | 900 | 98.2 | |

From Table 1 and Table 2, it can be seen that also in the case where the ratio (y % by mol) of the content of Ag to the total content of Fe, Pt and Ag was changed as above, a FePtC-based sputtering target having a relative density of not less than 90% was obtained by appropriately setting the sintering temperature. It can be seen that by increasing the ratio (y % by mol) of the content of Ag to the total content of Fe, Pt and Ag, a sputtering target of high density was obtained even at a lower sintering temperature.

From the results of Example 8 and Example 10, it can be understood that the relative density of the sputtering target can be improved by subjecting the FePtC-based sintered product to hot isostatic pressing.

The invention claimed is:

1. A sputtering target containing Fe, Pt, Ag and C, wherein the composition of the sputtering target is represented by $[(Fe_xPt_{100-x})_{100-y}—Ag_y]_{100-z}—C_z$ (x, y, z: % by mol), wherein x is 45 to 65, y is 1 to 20, and z is 13 to 59.

2. The sputtering target as claimed in claim 1, which is produced by calcining a raw material powder containing Fe powder, Pt powder, Ag powder and C powder.

3. The sputtering target as claimed in claim 1, which has a density of not less than 90%.

4. The sputtering target as claimed in claim 2, which has a density of not less than 90%.

* * * * *